Jan. 20, 1970 J. E. SOLOMON ET AL 3,491,307

DIFFERENTIAL AMPLIFIER FEATURING POLE SPLITTING
COMPENSATION AND COMMON MODE FEEDBACK
Filed June 22, 1967

INVENTORS
James E. Solomon
Walter Richard Davis
BY
Mueller, Aichele & Rauner
ATTY'S.

United States Patent Office 3,491,307
Patented Jan. 20, 1970

3,491,307
DIFFERENTIAL AMPLIFIER FEATURING POLE SPLITTING COMPENSATION AND COMMON MODE FEEDBACK

James E. Solomon and Walter Richard Davis, Phoenix, Ariz., assignors to Motorola, Inc., Franklin Park, Ill., a corporation of Illinois Filed June 22, 1967, Ser. No. 648,096
Int. Cl. H03f 3/68
U.S. Cl. 330—30 14 Claims

ABSTRACT OF THE DISCLOSURE

A wide band differential amplifier circuit in which a biased Darlington amplifier stage is cascaded to and driven by an input differential amplifier stage. The biased Darlington stage includes first and second differentially coupled transistors connected to and driven by first and second emitter follower transistors respectively. Capacitive feedback is provided between the first differentially coupled transistor and the first emitter follower transistor, and between the second differentially coupled transistor and the second emitter follower transistor; the above capacitive feedback splits two of the poles of the transfer function of the amplifier circuit. This pole splitting action causes one of two poles of the transfer function to narrowband and the other of the two poles to broadband to thereby provide single pole open loop response for the amplifier circuit. DC level shifting is provided between the input amplifier stage and the biased Darlington stage, and negative feedback is applied between output emitter followers of the amplifier circuit and the biased Darlington stage to insure good closed loop stability.

This invention relates generally to linear amplifiers and more particularly to a general purpose, multistage differential amplifier which may be constructed as a monolithic integrated circuit.

BACKGROUND OF THE INVENTION

Prior art direct coupled amplifiers have suffered from the defect that the input and output DC levels thereof exist at different potentials. This characteristic makes feedback networks for these amplifiers difficult to design and direct coupled cascaded stages in the overall amplifier circuits are difficult to power. In the linear amplifier art, prior attempts have been made to correct these shortcomings by introducing various DC level shifting networks in the amplifier circuits. These DC level shifting networks, however, created at least two problems: extra poles were introduced into the amplifier's transfer function, and due to normal component tolerances, input and output levels were still unequal. These prior art amplifiers were designed so that at least two poles of the amplifier's transfer function occurred at corner frequencies that caused the gain of the amplifier to decrease at 12db per octave. This latter characteristic reduces the gain-bandwidth product and frequency response of the amplifier and tends to degrade the overall performance thereof.

SUMMARY OF THE INVENTION

An object of this invention is to provide an amplifier circuit having an improved gain vs. frequency characteristic.

Another object of this invention is to provide an improved differential amplifier which may be constructed as an all NPN monolithic integrated circuit.

Another object of this invention is to provide an all purpose NPN monolithic differential amplifier in which a large amount of negative feedback may be applied without degrading the response of the amplifier.

Another object of this invention is to provide a differential amplifier having an improved DC drift and output set-up characteristic.

Another object of this invention is to provide a differential amplifier having a single-pole open loop response and excellent input and output quiescent point (Q point) stability.

Another object of this invention is to provide an amplifier circuit of the type described having a low common mode and differential drift, a large gain-bandwidth product and good power supply desensitivity.

Another object of this invention is to provide an amplifier circuit of the type described in which a large amount of negative feedback does not degrade the circuit performance.

A feature of this invention is an all NPN, monolithic integrated wideband differential amplifier having differential input and differential output connections and a large gain-bandwidth product.

Another feature of this invention is a monolithic differential amplifier having input and average output DC potentials which are at ground potential for split supply operation.

Another feature of this invention is a provision of a monolithic differential amplifier having a low output impedance and a large output signal swing provided by an output emitter follower stage.

Another feature of this invention is a provision of a stabilized output quiescent (Q) point which is realized by common mode feedback from the output stage of the amplifier to an intermediate amplifier stage.

A further feature of this invention is the provision of temperature compensation diodes which minimize temperature responsive voltage changes in the circuit.

A further feature of this invention is the provision of means for connecting external pole splitting capacitors between the differential outputs and differential inputs of an intermediate biased Darlington amplifier stage. These pole splitting capacitors broad band one of two poles of the amplifier's transfer function and narrow band the other pole to insure single pole open loop response. This latter feature permits increased feedback in the amplifier without degradation of circuit performance and compensates for the influence on pole location caused by a DC resistive level shifting network in the circuit.

Briefly described, the present invention is embodied in a monolithic integrated differential amplifier circuit including a first biased Darlington stage directly connected via a DC level shifting network to a second biased Darlington stage. Each of the biased Darlington stages includes an inner differentially connected pair of transistors each separately driven by an emitter follower transistor. Capacitive feedback is provided in the second stage between the outputs (collectors) of the inner transistor pair and the inputs (bases) of the emitter followers which drive the inner transistor pair. This capacitive feedback splits two of the poles of the amplifier's transfer function, narrow banding one of the poles and broad banding the other pole to insure single pole open loop response and closed loop stability. The inner pair of differentially connected transistors in the intermediate or second biased Darlington stage is directly coupled to output emitter followers, thereby imparting to the monolithic amplifier circuit excellent current drive capability. A negative common mode feedback loop including another pair of differentially connected transistors is connected between the output emitter followers and the second or intermediate biased Darlington stage. This feedback loop provides output quiescent (Q) point stability and holds the average output at ground potential for split supply operation.

DETAILED DESCRIPTION OF THE INVENTION

Identification of circuit stages

Figure 1:
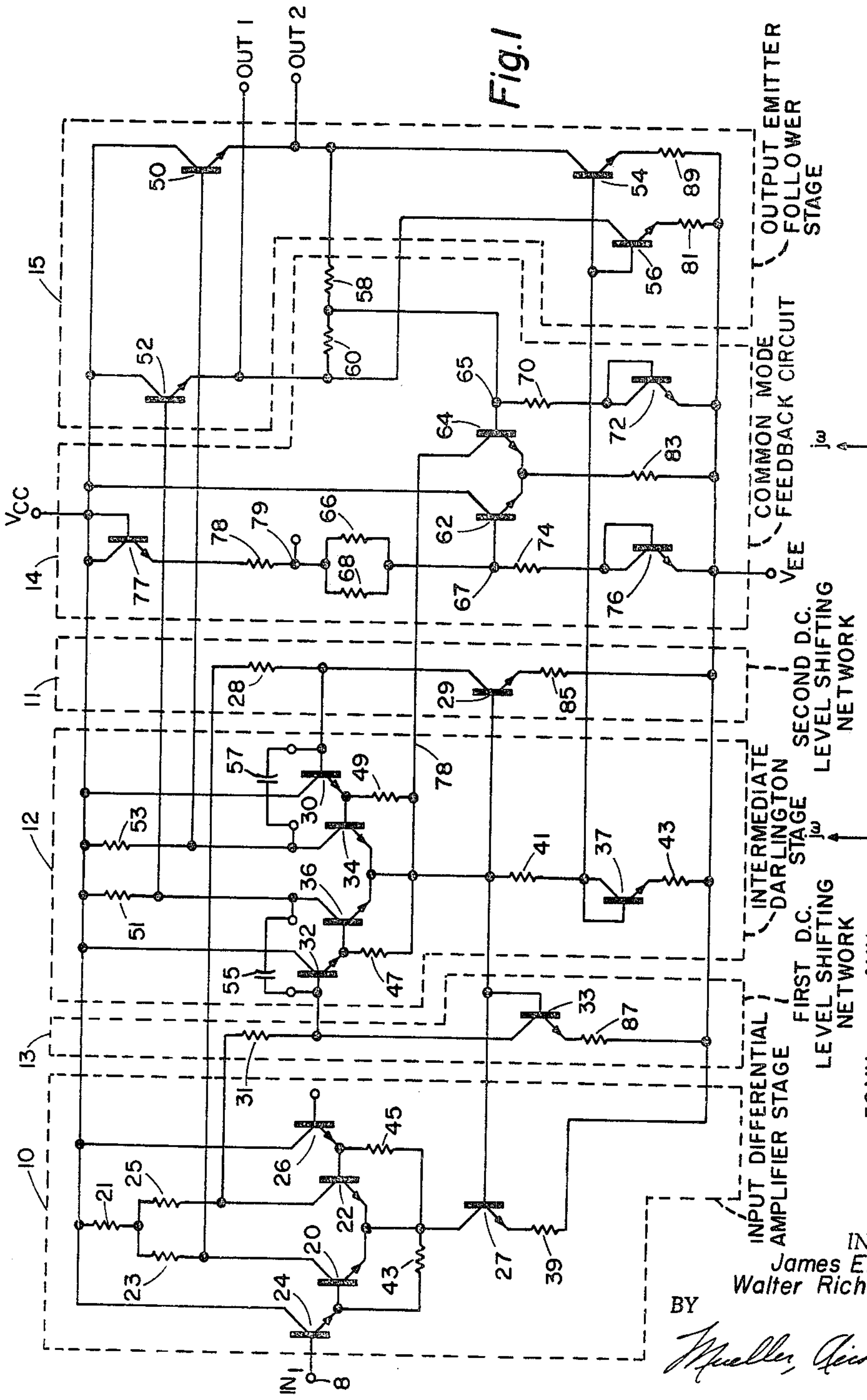
FIG. 1 is a schematic diagram of the monolithic differential amplifier according to this invention.

In the following description of the invention some components in each stage of the amplifier will be specifically identified to insure a good understanding of the stage itself. Other components in the various stages of the amplifier will be specifically referred to only in the description of "operation" of the amplifier.

The input stage 10 of the amplifier includes emitter coupled transistors 20 and 22 forming an inner emitter coupled pair; these transistors are directly driven by emitter followers 24 and 26 in a biased Darlington connection. Transistor 27 provides a constant current sink for the first or input stage 10. The collector outputs of transistors 20 and 22 are connected respectively to first and second DC level shifting networks 11 and 13, and the latter networks include respectively resistors 28 and 31 which are connected to transistor current sinks 29 and 33 respectively.

The intermediate points between the last named resistors 31 and 28 and current sink transistors 33 and 29 in the respective DC level shifting networks 13 and 11 are directly connected to the emitter followers 30 and 32 of the intermediate or second biased Darlington stage. These first and second emitter followers 30 and 32 directly drive first and second transistors 34 and 36 in the inner, emitter coupled transistor pair of the second biased Darlington stage. Diode 37 and transistor 64 sink the output current from the intermediate Darlington stage 12.

First and second emitter follower output transistors 50 and 52 are connected as shown to the collectors of the emitter coupled transistors 34 and 36 of the intermediate biased Darlington stage and in series respectively with current sink transistors 54 and 56. The output emitter followers 50 and 52 and their respective current sink transistors 54 and 56 may be considered as the output stage 15 of the amplifier. "Pull down" current sinks 54 and 56 are used instead of bias resistors for the emitter followers 50 and 52 because they allow larger negative swings and can be fabricated in less die area than can the diffused resistors.

The output common mode feedback circuit of the amplifier, identified by block 14, will be described in detail below in the description of operation.

Operation

Input signals to be amplified are differentially applied to input terminals 7 and 8 of the input, differential biased Darlington stage 10, and the amplified signals from the differential stage 10 are coupled from the collectors of transistors 20 and 22 and through resistors 28 and 31 to the bases of the emitter followers 30 and 32 of the second biased Darlington stage 12. The collector load resistors 23 and 25 in the input differential amplifier stage are relatively small, e.g., in the order of 1.1 kilohm in order to broad band the amplifier stage 10. To establish proper DC levels, the collector load resistors 23 and 25 are connected to the common mode dropping resistor 21.

In the second Darlington stage the signals are further amplified to increase the gain of the overall amplifier circuit, and the amplified signals from the intermediate differential amplifier stage 12 are directly coupled to the output emitter followers 50 and 52 respectively. The emitter follower output connection shown provides a low output impedance and high current drive capability for the amplifier.

The DC level shifting stage of the amplifier consists of sections 11 and 13 of the amplifier and these sections have been previously described. The resistors 28 and 31 shift the DC levels at the collectors of the transistors 20 and 22 by a predetermined amount to prevent the DC level in the signal path of the amplifier from building up toward the positive supply voltage $V_{CC}$.

Both the input or first differential amplifier stage 10 and intermediate or second amplifier stage 12 include matched diffused emitter follower resistors 43, 45 and 47, 49 respectively and matched diffused collector load resistors 23, 25 and 51, 53 respectively.

The output common mode feedback circuit of the amplifier, identified by block 14, includes a pair of differentially connected transistors 62 and 64 which are connected between points 65 and 67. Resistors 66, 68, 60, 58 and resistors 70, 74 are matched. Thus, if the average potential at the emitters of transistors 50 and 52 is equal to the potential at point 79, then the potentials at points 65 and 67 will also be equal. Conversely, if the former potentials are not equal, then an error signal from transistor 64 is applied via conductor 78 to the intermediate stage 12 of the amplifier in such a way as to reduce the error signal and bring points 65 and 67 into equality. Thus the average potential of the outputs will be equal to the potential at point 79. For split supply operation, point 79 is at ground potential, and for single supply operation, i.e., $V_{EE}$ at ground potential and $V_{CC}$ twice the value for split supply operation, point 79 is at $V_{CC}/2$ or half the output signal swing.

Figures 2A, 2B:
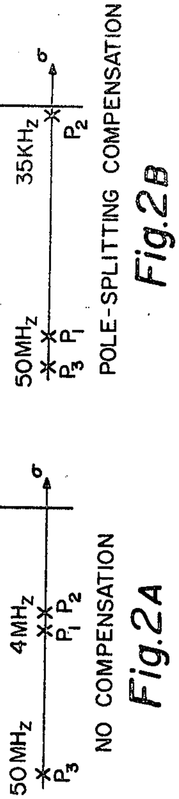
FIGS. 2A and 2B illustrate respectively the location of two poles of the amplifier's transfer function without pole splitting compensation and with pole splitting compensation in accordance with the present invention.

FIGS. 2A and 2B illustrate the pole splitting compensation within the amplifier circuit of this invention, and such compensation provided by external capacitors 55 and 57 which are represented in FIG. 1 by dashed lines. These dashed lines are intended to indicate that the pole splitting capacitors 55 and 57 are not normally built within the monolithic amplifier package sold. FIG. 2A illustrates the location of three poles, $P_1$, $P_2$ and $P_3$ of the transfer function of a differential amplifier with resistive DC level shifting and having no external feedback capacitors.

Poles $P_1$ and $P_2$ occur in the vicinity of 4 megahertz and a broadband pole $P_3$ occurs in the vicinity of 50 megahertz. The occurrence of poles $P_1$ and $P_2$ in FIG. 2A causes the gain vs. frequency characteristic of the amplifier to fall off at 12 db per octave at the first corner frequency which occurs at approximately 4 megahertz. Pole $P_3$ is produced by a combination of the two matched collector load resistors 23 and 25, the collector capacitance of the emitter coupled transistors 20 and 22 plus the distributed capacitance of the resistors 28 and 31. Pole $P_3$ is not affected by pole splitting compensation. In FIG. 2A, pole $P_2$ is produced by a combination of resistors 28 and 31 and the input capacitance of the second differential amplifier stage 12. Pole $P_1$ is produced by the output capacitance of the second differential stage plus the input capacitance of the output emitter followers 50 and 52.

With the pole splitting capacitors 55 and 57 connected to the amplifier circuit as illustrated in FIG. 1, pole $P_1$ broadbands and pole $P_2$ narrowbands, resulting in a gain vs. frequency characteristic which rolls off at 6 db octave at a new corner frequency (determined by capacitors 55 and 57) rather than 12 db per octave at the first corner frequency. The pole splitting compensation according to this invention provides a much improved response over the 12 db per octave roll-off for the gain vs. frequency characteristic produced by poles $P_1$ and $P_2$ in FIG. 2A.

With the feedback capacitors 55 and 57 connected to the amplifier circuit as shown, poles $P_1$, $P_2$ and $P_3$ in FIG. 2A are produced by the following combinations of resistance and capacitance in amplifier. Pole $P_1$ is produced by a combination of the two collector load resistors 51 and 53, the input capacitance of the two output emitter followers 50 and 52 and the output capacitance of the second differential amplifier stage 12. The output capacitance of the second differential amplifier stage 12 is equal to the collector capacitance of the emitter coupled transistors 34 and 36 which is effectively reduced by the external capacitors 57 and 55. With pole splitting compensation, pole $P_2$ is produced by a combination of the two DC level shifting resistors 28 and 31, the input capacitance of the second differential amplifier stage 12, and the collector capacitance of the current sink transistors 29 and 33 in the DC level shifting stages 11 and 13 respectively. The input capacitance of the second differential amplifier stage 12 is increased by pole-splitting capacitors 55 and 57 due to Miller effect, i.e., multiplication effect, thus causing $P_2$ to narrowband.

The differential amplifier described above has been constructed in a chip of silicon using diffused resistors as is known in the art of integrated circuit construction. The total resistance on a single chip is limited by the available area thereof to approximately 200 kilohms, and minimum resistor widths have been reduced to approximately 0.3 mil by the use of improved masking and etching techniques. It is easier and more economical to use the DC level shifting networks in the amplifier circuit of this invention rather than to use complimentary PNP and NPN transistors. It is more difficult to construct the complementary transistors on a single chip than it is to construct the diffused resistors 28 and 31 and the current sinks 29 and 33 which form the level shifting networks. However, a substitution of complementary transistors for level shifting networks is clearly within the scope of this invention.

The second differential Darlington stage 12 provides a major portion of the overall amplifier gain, large output signal swings and a high input impedance necessary to avoid gain loss in the level shifting stages.

A monolithic differential amplifier according to this invention contains 21 transistors, 115 kilohms total resistance, and occupies a 50 mil square die. The open loop voltage gain of the circuit is in the order of 3,000, the input impedance is approximately 500 kilohms, and the differential output voltage swing is 20 volts peak to peak.

The following table of voltage and resistor values is given by way of illustration only and lists those values used in the differential amplifier circuit of the type shown in FIG. 1 which was actually built and successfully tested.

TABLE

| | | Value |
|---|---|---|
| Voltage Supply: | | |
| $V_{EE}$ | volts | −6 |
| $V_{CC}$ | do | +6 |
| Resistors: | | |
| **21** | kilohm | 0.950 |
| **23** | do | 1.1 |
| **25** | do | 1.1 |
| **28** | do | 5.33 |
| **31** | do | 5.33 |
| **39** | do | 0.730 |
| **41** | do | 0.955 |
| **43** | do | 7.4 |
| **45** | do | 7.4 |
| **47** | do | 7.4 |
| **49** | do | 7.4 |
| **51** | do | 5.26 |
| **53** | do | 5.26 |
| **58** | do | 11.75 |
| **60** | do | 11.75 |
| **66** | do | 11.75 |
| **68** | do | 11.75 |
| **70** | do | 0.700 |
| **74** | do | 0.700 |
| **78** | do | 6.58 |
| **81** | do | 0.300 |
| **83** | do | 0.227 |
| **85** | do | 1.67 |
| **87** | do | 1.67 |
| **89** | do | 0.300 |
| Capacitors: | | |
| **55** | picofarads | 5 |
| **57** | do | 5 |

We claim:

1. A wideband differential amplifier circuit in which one differential amplifier stage is cascaded to and driven by another differential amplifier stage, the one differential amplifier stage including first and second differentially coupled transistors connected to and driven by first and second emitter follower transistors respectively, the improvement comprising: first capacitance feedback means connected between said first differentially coupled transistor and said first emitter follower transistor, and second capacitance feedback means connected between said second differentially coupled transistor and said second emitter follower transistor, said first and second capacitance feedback means splitting two of the poles of the transfer function of the amplifier circuit, causing one of the two poles to narrowband and the other of the two poles to broadband and to thereby provide a single pole open loop response for said amplifier circuit.

2. A wideband general purpose differential amplifier circuit including in combination:

(a) a first differential amplifier stage connectable to a source of input signals, (b) a DC level shifting network including a first level shifting resistor connected to one output of said first amplifier stage for shifting the DC level of output signals at said input amplifier stage to a preselected level, (c) a biased Darlington amplifier stage including first and second emitter coupled transistors connected to and driven by respectively first and second emitter follower transistors, one of said first and second emitter follower transistors connected to said first level shifting resistor and driven by output signals from said input amplifier stage, (d) first capacitance means connected between said first emitter coupled transistor and said first emitter follower transistor, (e) second capacitance means connected between said second emitter coupled transistor and said second emitter follower transistor, said first and second capacitance means splitting two poles of the transfer function of said amplifier, narrowbanding one pole and broadbanding the other to provide a single pole open loop response for said differential amplifier circuit.

3. The differential amplifier circuit according to claim 2 wherein:

(a) said first amplifier stage includes first and second emitter coupled transistors connected to and driven by respectively first and second emitter follower transistors, said first and second emitter follower transistors of said first stage connectable to a source of input signals, (b) said DC level shifting network further including a second level shifting resistor connected between another output of said first amplifier stage and the other of said first and second emitter follower transistors of said biased Darlington amplifier stage, and (d) a first emitter follower transistor connected to one of said first and second emitter coupled transistors in said biased Darlington amplifier stage for providing improved current drive capability and low output impedance for said differential amplifier circuit.

4. The amplifier circuit according to claim 3 which further includes feedback circuit means connected between said first output emitter follower transistor and said Darlington amplifier stage for stabilizing the output quiescent point of said amplifier circuit.

5. The amplifier circuit according to claim 4 wherein:

(a) said DC level shifting network further includes a first current sink transistor connected in series with said first level shifting resistor for providing a substantially constant DC current through said first level shifting resistor, and (b) a second current sink transistor connected in series with said second level shifting resistor for providing a substantially constant DC current therethrough.

6. The amplifier circuit according to claim 5 which further includes:

(a) a first current sink transistor connected to first and second differentially coupled transistors in said first amplifier stage for providing a substantially constant current therethrough, (b) a second current sink transistor connected to said first and second emitter coupled transistors in said biased Darlington amplifier stage for providing a substantially constant current therethrough, and (c) said feedback means includes an additional pair of differentially coupled transistors connected between said first emitter follower output transistor and said biased Darlington amplifier stage for providing a negative feedback signal thereto, one of said transistors in said additional pair connected to a reference bias potential and switched against the other transistor in said additional pair which is connected to said first output emitter follower transistor and to said biased Darlington amplifier stage.

7. A wideband monolithic integrated differential amplifier including, in combination:

(a) a first differential amplifier stage including first and second emitter coupled transistors directly driven by first and second emitter follower transistors respectively in a Darlington amplifier circuit connection, (b) a second differential amplifier stage including first and second emitter coupled transistors directly driven by first and second emitter follower transistors in a Darlington amplifier circuit connection, said first and second emitter follower transistors in said second differential amplifier stage DC coupled to the outputs of said first and second emitter coupled transistors respectively in said first amplifier stage and differentially driven thereby, (c) output circuit means connected to said first and second emitter coupled transistors in said second differential amplifier stage for providing an output signal for said amplifier circuit, (d) means for applying capacitive feedback between the first emitter coupled transistor in said second amplifier stage and said first emitter follower transistor therein, (e) means for applying capacitive feedback between said second emitter coupled transistor in said second differential amplifier stage and said second emitter follower transistor therein, said means for applying capacitive feedback in said second differential amplifier stage splitting two poles in the open loop transfer function of said amplifier circuit whereby one of said poles broadbands and the other said pole narrowbands, thereby insuring single pole open loop response and closed loop stability for said amplifier circuit.

8. The amplifier circuit as defined in claim 7 which further includes:

(a) a first DC level shifting network having a first resistor and a first current sink transistor serially connected to one of said first and second emitter coupled transistors in said first differential amplifier stage to shift the DC level of the output signal of said first differential amplifier stage, and (b) a second DC level shifting network having a second resistor and a second current sink transistor serially connected to the other of said first and second emitter coupled transistors in said first differential amplifier stage for shifting the DC level of the output signal of said other transistor, said first and second DC level shifting networks connected respectively to said first and second emitter follower transistors in said second differential amplifier stage.

9. The amplifier circuit as defined in claim 8 wherein said output circuit means includes:

(a) a first output emitter follower transistor connected to the output of said first emitter coupled transistor in said second amplifier stage, (b) a second output emitter follower transistor connected to the output of said second emitter coupled transistor in said second differential amplifier stage, (c) common mode feedback means including a pair of differentially connected transistors, one of which is driven by said first and second output emitter followers and the other of which is connected to a bias potential, and (d) means connecting one of said pair of differentially connected transistors in said common mode feedback circuit means to said second amplifier stage for providing a negative feedback signal thereto.

10. The amplifier circuit as defined in claim 9 wherein:

(a) said output circuit means further includes first and second matched resistors connected respectively between said first and second output emitter follower transistors and said other transistor in said pair of differentially connected transistors in said feedback circuit means, (b) a bias network connected to said one transistor in the last named pair of differentially connected transistors and also including a matched pair of resistors equal in value to said pair of resistors in said output circuit means, said bias network providing a reference potential for said one transistor in said pair of differentially connected transistors in said feedback circuit means, said reference potential equal to the DC potential applied to the other transistor in said last named pair of differentially connected transistors under static conditions.

11. The amplifier circuit as defined in claim 10 which further includes:

(a) a first current sink diode connected between a common output point of said first named pair of matched resistors and a point of reference potential, (b) a second current sink diode connected between a common output point of the other pair of matched resistors and a point of reference potential, (c) a temperature compensating diode connected as a current sink for the output of said emitter coupled transistors in said second differential amplifier stage, said temperature compensating diode providing temperature compensation for: a first current sink transistor connected to the emitter coupled transistors in said first differential amplifier stage, a second and third current sink transistor in said first and second DC level shifting networks, respectively, and a fourth and a fifth current sink transistor which are connected to the outputs of said first and second output emitter followers respectively.

12. A differential amplifier including in combination:

(a) a differential amplifier stage having a current output node, (b) an output stage having a sense node at which the variation in the quiescent point of the amplifier may be sensed, and (c) a common mode feedback circuit including first and second differentially coupled transistors, said first transistor connected to a reference potential and said second transistor connected to said sense node, said second transistor further connected to said current output node and operative to vary the current in said differential amplifier stage in response to voltage variations at said sense node, thereby stabilizing the quiescent point of said differential amplifier.

13. The differential amplifier defined in claim 12 which further includes an input differential amplifier stage connected to said first named differential amplifier stage, said input differential amplifier stage having a current sink transistor therein connected to said second transistor in said common mode feedback circuit, said current sink transistor responsive to current variations in said first named differential amplifier stage to further stabilize the quiescent point of said amplifier circuit.

14. The differential amplifier defined in claim 13 wherein said first named differential amplifier stage includes:

(a) first and second differentially coupled transistors connected to and driven by first and second emitter follower transistors, (b) first capacitance feedback means connected between said first differentially coupled transistor and said first emitter follower transistor, and (c) second capacitance feedback means connected between said second differentially coupled transistor and said second emitter follower transistor, said first and second capacitance feedback means splitting two poles of the transfer function of the amplifier circuit, causing one of the two poles to narrowband and the other of the two poles to broadband and thereby provide a substantially single pole open loop response for said amplifier.

References Cited

UNITED STATES PATENTS 3,281,703 10/1966 Bladen ------------ 330—26 X
3,290,520 12/1966 Wennik ---------- 330—69 X

FOREIGN PATENTS 849,316 9/1960 Great Britain.

OTHER REFERENCES

"Monolithic Differential Amplifier," Electronic Design, p. 38, 6-21-65.

"IC Operational Amplifier," The Electronic Engineer, p. 128, November 1966.

ROY LAKE, Primary Examiner

L. J. DAHL, Assistant Examiner

U.S. Cl. X.R.

330—26